US012720901B1

(12) United States Patent
Matsumoto

(10) Patent No.: US 12,720,901 B1
(45) **Date of Patent: *Aug. 25, 2026**

(54) IMAGE SENSOR AND IMAGE-CAPTURING APPARATUS

(71) Applicant: NIKON CORPORATION, Tokyo (JP)

(72) Inventor: Shigeru Matsumoto, Sagamihara (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/674,244

(22) Filed: May 24, 2024

Related U.S. Application Data

(60) Continuation of application No. 18/130,940, filed on Apr. 5, 2023, now Pat. No. 12,040,342, which is a (Continued)

(30) Foreign Application Priority Data

Mar. 29, 2016 (JP) ................................ 2016-065491

(51) Int. Cl.

| | |
|---|---|
| ***H04N 25/79*** | (2023.01) |
| ***H03M 1/56*** | (2006.01) |
| ***H04N 25/75*** | (2023.01) |
| ***H04N 25/76*** | (2023.01) |
| ***H04N 25/771*** | (2023.01) |
| ***H04N 25/772*** | (2023.01) |

(Continued)

(52) U.S. Cl.
CPC ............ *H10F 39/811* (2025.01); *H03M 1/56* (2013.01); *H04N 25/75* (2023.01); *H04N 25/76* (2023.01); *H04N 25/771* (2023.01); *H04N 25/772* (2023.01); *H04N 25/79* (2023.01); *H10F 39/12* (2025.01); *H10F 39/8053* (2025.01); *H10F 39/8063* (2025.01); *H10W 20/20* (2026.01)

(58) Field of Classification Search
CPC ............................ H04N 25/772; H04N 25/79
See application file for complete search history.

(56) References Cited

U.S. PATENT DOCUMENTS 6,115,066 A 9/2000 Gowda et al.
10,998,367 B2 * 5/2021 Matsumoto ............ H03M 1/56
(Continued)

FOREIGN PATENT DOCUMENTS

CN 104253953 A 12/2014
CN 104754253 A 7/2015
(Continued)

OTHER PUBLICATIONS

May 16, 2017 International Search Report issued in International Patent Application No. PCT/JP2017/007550.
(Continued)

*Primary Examiner* — Thanh Luu
(74) *Attorney, Agent, or Firm* — Oliff PLC

(57) ABSTRACT

An image sensor includes a plurality of substrates that are laminated on each other. The plurality of substrates includes: a first photoelectric conversion unit that photoelectrically converts light to an electric charge, and a first conversion unit that converts a first signal that is based on the electric charge converted by the first photoelectric conversion unit into a digital signal. The first conversion unit is configured by a circuit arranged on two or more substrates among the plurality of substrates.

23 Claims, 9 Drawing Sheets

Related U.S. Application Data division of application No. 17/191,852, filed on Mar. 4, 2021, now Pat. No. 11,652,128, which is a division of application No. 16/082,901, filed as application No. PCT/JP2017/007550 on Feb. 27, 2017, now Pat. No. 10,998,367.

(51) Int. Cl.

| | |
|---|---|
| ***H10F 39/00*** | (2025.01) |
| ***H10F 39/12*** | (2025.01) |
| ***H10W 20/20*** | (2026.01) |

(56) References Cited

U.S. PATENT DOCUMENTS

| | | | | |
|---|---|---|---|---|
| 11,652,128 | B2 * | 5/2023 | Matsumoto | H10F 39/8053 250/208.1 |
| 2003/0052983 | A1 | 3/2003 | Altree | |
| 2010/0276572 | A1 | 11/2010 | Iwabuchi et al. | |
| 2013/0026343 | A1 | 1/2013 | Saito et al. | |
| 2013/0068929 | A1 * | 3/2013 | Solhusvik | H10F 39/809 250/208.1 |
| 2013/0100326 | A1 | 4/2013 | Ueno | |
| 2013/0320197 | A1 * | 12/2013 | Asayama | H01L 25/167 250/208.1 |
| 2014/0036125 | A1 | 2/2014 | Hagihara | |
| 2015/0002715 | A1 | 1/2015 | Ise | |
| 2015/0162074 | A1 | 6/2015 | Lin et al. | |
| 2015/0163403 | A1 | 6/2015 | Wakabayashi | |
| 2015/0163433 | A1 | 6/2015 | Uchida et al. | |
| 2015/0189214 | A1 | 7/2015 | Kurose | |
| 2015/0244963 | A1 | 8/2015 | Totsuka | |
| 2017/0155865 | A1 | 6/2017 | Nakajima et al. | |
| 2017/0347050 | A1 * | 11/2017 | Sakakibara | H04N 25/772 |
| 2018/0007304 | A1 * | 1/2018 | Sakakibara | G01S 7/4815 |
| 2018/0240797 | A1 | 8/2018 | Yokoyama et al. | |

FOREIGN PATENT DOCUMENTS

| | | | |
|---|---|---|---|
| CN | 104900257 | A | 9/2015 |
| EP | 2889908 | A1 | 7/2015 |
| EP | 3435658 | A1 | 1/2019 |
| EP | 3439039 | A1 | 2/2019 |
| JP | 2003-169258 | A | 6/2003 |
| JP | 2007-300189 | A | 11/2007 |
| JP | 2013-030997 | A | 2/2013 |
| JP | 2015-41838 | A | 3/2015 |
| JP | 2015-126043 | A | 7/2015 |
| JP | 2015-521390 | A | 7/2015 |
| JP | 2015-141838 | A | 8/2015 |
| JP | 2015-159464 | A | 9/2015 |
| WO | 2006/129762 | A1 | 12/2006 |
| WO | 2013/183266 | A2 | 12/2013 |
| WO | 2015/159728 | A1 | 10/2015 |
| WO | 2017/163774 | A1 | 9/2017 |
| WO | 2017/169480 | A1 | 10/2017 |

OTHER PUBLICATIONS

Aug. 19, 2019 Extended European Search Report issued in European Patent Application No. 17773991.9.

Itoh, Y. et al., "4-Layer 3-D IC with a function of parallel signal processing". Microelectronic Engineering, vol. 15, pp. 187-190, 1991.

Nov. 12, 2019 Office Action issued in Japanese Patent Application No. 2018-508814.

Apr. 22, 2020 Office Action Issued in U.S. Appl. No. 16/082,901.

May 25, 2020 Office Action issued in Chinese Patent Application No. 201780020504.1.

Sep. 16, 2020 Office Action Issued in U.S. Appl. No. 16/082,901.

Dec. 2, 2020 Notice of Allowance Issued in U.S. Appl. No. 16/082,901.

Feb. 24, 2021 Office Action issued in Chinese Patent Application No. 201780020504.1.

Apr. 1, 2021 Notice of Allowance Issued in U.S. Appl. No. 16/082,901.

Aug. 10, 2021 Office Action issued in Japanese Patent Application No. 2020-109908.

Jan. 4, 2022 Decision of Refusal issued in Japanese Patent Application No. 2020-109908.

Mar. 3, 2022 Office Action Issued In U.S. Appl. No. 17/191,852.

Sep. 20, 2022 Office Action issued in U.S. Appl. No. 17/191,852.

Jan. 11, 2023 Notice of Allowance issued in U.S. Appl. No. 17/191,852.

Mar. 7, 2023 Office Action issued in Japanese Patent Application No. 2022-062544.

Mar. 22, 2023 Notice of Allowance Issued in U.S. Appl. No. 17/191,852.

Sep. 26, 2023 Office Action issued in Japanese Patent Application No. 2022-062544.

Oct. 17, 2023 U.S. Office Action issued U.S. Appl. No. 18/130,940.

Apr. 5, 2024 Notice of Allowance issued in U.S. Appl. No. 18/130,940.

Mar. 5, 2025 Office Action issued in Japanese Patent Application No. 2024-078621.

1 Nov. 4, 2025 Decision of Refusal issued in Japanese Patent Application No. 2024-078621.

* cited by examiner

IMAGE SENSOR AND IMAGE-CAPTURING APPARATUS

This is a continuation of U.S. patent application Ser. No. 18/130,940 filed Apr. 5, 2023 (now U.S. Pat. No. 12,040,342), which in turn is a divisional of U.S. patent application Ser. No. 17/191,852 filed Mar. 4, 2021 (now U.S. Pat. No. 11,652,128), which is a divisional of U.S. patent application Ser. No. 16/082,901 filed Oct. 22, 2018 (now U.S. Pat. No. 10,998,367), which is a U.S. National Stage of International Application No. PCT/JP2017/007550 filed Feb. 27, 2017, which claims priority from Japanese Application No. 2016-065491 filed in Japan on Mar. 29, 2016. The entire contents of each of the above-identified prior applications is incorporated by reference herein.

TECHNICAL FIELD

The present invention relates to an image sensor and an image-capturing apparatus.

BACKGROUND ART

PTL1 discloses an image sensor that performs analog/digital conversion on a signal from a pixel and stores a digital signal in a storage unit. However, in the prior art, an arrangement of a plurality of storage units increases the chip area of the image sensor.

CITATION LIST

Patent Literature

PTL1: Japanese Laid-Open Patent Publication No. 2013-30997

SUMMARY OF INVENTION

An image sensor according to the 1st aspect of the present invention comprises a photoelectric conversion unit that photoelectrically converts incident light to generate an electric charge; and an AD conversion unit having a comparison unit that compares a signal caused by an electric charge generated by the photoelectric conversion unit with a reference signal, a first storage unit provided in a first circuit layer, the first storage unit storing a first signal based on a signal output from the comparison unit, and a second storage unit provided in a second circuit layer that is stacked on the first circuit layer, the second storage unit storing a second signal based on the signal output from the comparison unit.

An image sensor according to the 2nd aspect of the present invention comprises a photoelectric conversion unit that photoelectrically converts incident light to generate an electric charge; a comparison unit that compares a signal caused by the electric charge generated by the photoelectric conversion unit with a reference signal; a first storage unit provided in a first circuit layer, the first storage unit storing a first signal based on a signal output from the comparison unit; and a second storage unit provided in a second circuit layer, the second storage unit storing a second signal based on the signal output from the comparison unit, wherein: the first circuit layer and the second circuit layer are arranged from a side on which light is incident.

An image sensor according to the 3rd aspect of the present invention comprises a first circuit layer having a comparison unit that compares a signal caused by an electric charge generated by a photoelectric conversion unit with a reference signal, the photoelectric conversion unit photoelectrically converting incident light to generate the electric charge; and a second circuit layer stacked on the first circuit layer, the second circuit layer having a storage unit that stores a signal based on a signal output from the comparison unit.

An image-capturing apparatus according to the 4th aspect of the present invention comprises the image sensor according to any one of claims 1 to 21; and an image generation unit that generates image data based on a signal from the image sensor.

BRIEF DESCRIPTION OF DRAWINGS

FIG. 6(*b*) is a timing chart illustrating an operation example of the AD conversion unit according to the first embodiment.

DESCRIPTION OF EMBODIMENTS

First Embodiment

Figure 1:
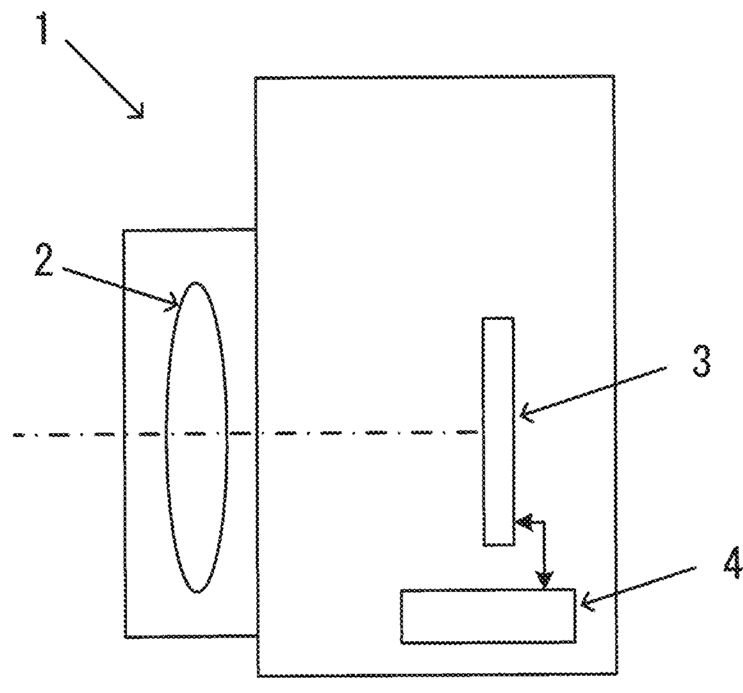
FIG. 1 is a block diagram illustrating a configuration of an image-capturing apparatus according to a first embodiment.

FIG. 1 is a block diagram illustrating a configuration of an image-capturing apparatus according to a first embodiment. The image-capturing apparatus 1 includes a photographing optical system 2, an image sensor 3, and a control unit 4. The image-capturing apparatus 1 is, for example, a camera. The photographing optical system 2 forms a subject image on the image sensor 3. The image sensor 3 captures the subject image formed by the photographing optical system 2 and generates an image signal. The image sensor 3 is, for example, a CMOS image sensor. The control unit 4 outputs, to the image sensor 3, a control signal for controlling the operation of the image sensor 3. Additionally, the control unit 4 performs various types of image processing on the image signal output from the image sensor 3 and functions as an image generation unit that generates image data. Note that the photographing optical system 2 may be detachable from the image-capturing apparatus 1.

Figure 2:
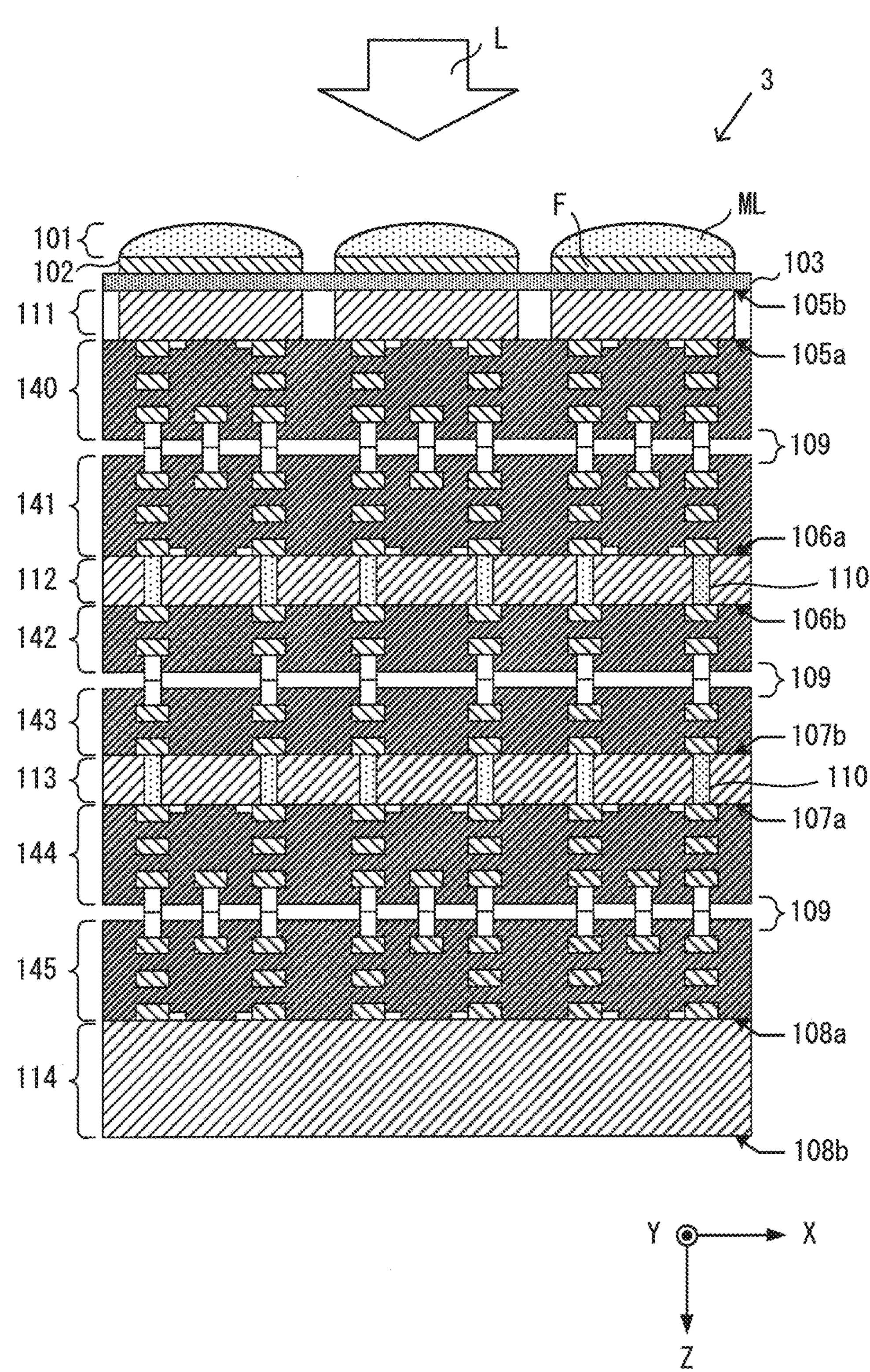
FIG. 2 is a view illustrating a cross-sectional structure of an image sensor according to the first embodiment.

FIG. 2 is a view illustrating a cross-sectional structure of the image sensor according to the first embodiment. The image sensor 3 illustrated in FIG. 2 is a back side illumination type image sensor. The image sensor 3 includes a first substrate 111, a second substrate 112, a third substrate 113, and a fourth substrate 114. The first substrate 111, the second substrate 112, the third substrate 113, and the fourth substrate 114 each include a semiconductor substrate or the like. The first substrate 111 is stacked with the second substrate 112 via a wiring layer 140 and a wiring layer 141. The second substrate 112 is stacked with the third substrate 113 via a wiring layer 142 and a wiring layer 143. The third substrate 113 is stacked with the fourth substrate 114 via a wiring layer 144 and a wiring layer 145. Incident light L indicated by an outline arrow is incident in a Z-axis plus direction. Further, as illustrated in the coordinate axes, the rightward direction of the paper sheet orthogonal to the Z-axis is the X-axis plus direction, and the front direction of the paper sheet orthogonal to the Z-axis and the X-axis are the Y-axis plus direction. In the image sensor 3, the first substrate 111, the second substrate 112, the third substrate 113, and the fourth substrate 114 are stacked in a direction in which the incident light Lis incident.

The image sensor 3 further includes a microlens layer 101, a color filter layer 102, and a passivation layer 103. The passivation layer 103, the color filter layer 102, and the microlens layer 101 are sequentially stacked on the first substrate 111. The microlens layer 101 has a plurality of microlenses ML. The microlenses ML collect the incident light on a photoelectric conversion unit 12, which will be described later. The color filter layer 102 has a plurality of color filters F. The passivation layer 103 includes a nitride film or an oxide film.

The first substrate 111, the second substrate 112, the third substrate 113, and the fourth substrate 114 each have a first surface 105*a*, 106*a*, 107*a*, 108*a* on which gate electrodes and gate insulating films are provided, and a second surface 105*b*, 106*b*, 107*b*, 108*b* that is different from the first surface, respectively. Additionally, the first surfaces 105*a*, 106*a*, 107*a*, 108*a* are each provided with various elements such as transistors. Wiring layers 140, 141, 144, 145 are respectively stacked on the first surface 105*a* of the first substrate 111, the first surface 106*a* of the second substrate 112, the first surface 107*a* of the third substrate 113, and the first surface 108*a* of the fourth substrate 114. Furthermore, wiring layers (inter-substrate connecting layers) 142, 143 are respectively stacked on the second surface 106*b* of the second substrate 112 and the second surface 107*b* of the third substrate 113. The wiring layers 140-145 are layers including conductive films (metal films) and insulating films, and each wiring layer has a plurality of wires, vias, and the like arranged therein.

Elements on the first surface 105*a* of the first substrate 111 and elements on the first surface 106*a* of the second substrate 112 are electrically connected to each other by a connecting part 109 such as a bump or an electrode, via the wiring layers 140, 141. Similarly, elements on the first surface 107*a* of the third substrate 113 and elements on the first surface 108*a* of the fourth substrate 114 are electrically connected to each other by a connecting part 109 such as a bump and an electrode, via the wiring layers 144, 145. Additionally, the second substrate 112 and the third substrate 113 have a plurality of through-hole electrodes 110 such as through-silicon vias. The through-hole electrodes 110 of the second substrate 112 connect circuits provided on the first surface 106*a* and the second surface 106*b* of the second substrate 112 to each other, and the through-hole electrodes 110 of the third substrate 113 connect circuits provided on the first surface 107*a* and the second surface 107*b* to each other. The circuit provided on the second surface 106*b* of the second substrate 112 and the circuit provided on the second surface 107*b* of the third substrate 113 are electrically connected to each other by a connecting part 109 such as a bump or an electrode via the inter-substrate connection layers 142, 143.

Figure 3:
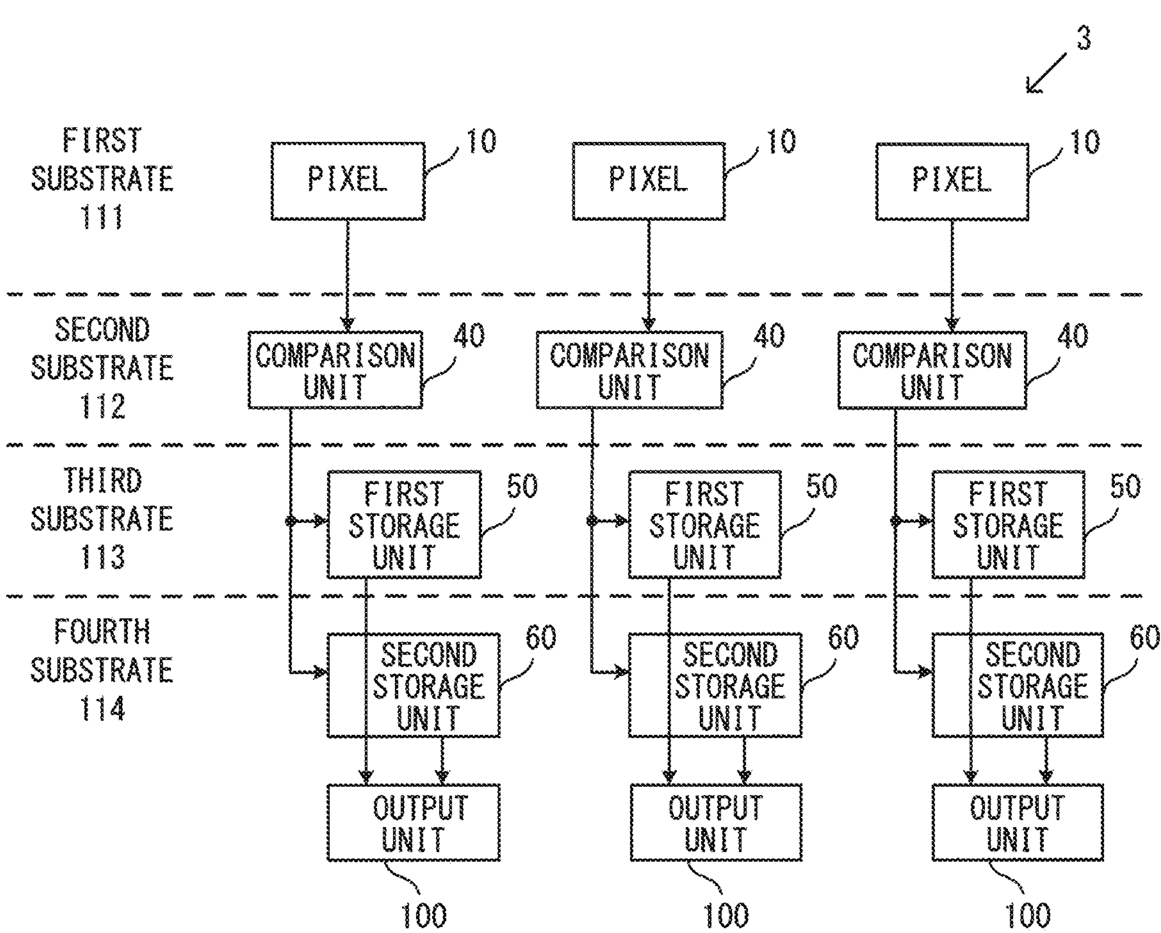
FIG. 3 is a block diagram illustrating a configuration of the image sensor according to the first embodiment.

FIG. 3 is a block diagram illustrating a configuration of the image sensor according to the first embodiment. The first substrate 111 has a plurality of pixels 10 arranged two-dimensionally. The plurality of pixels 10 are arranged in the X-axis direction and the Y-axis direction illustrated in FIG. 2. The pixels 10 output signals based on the electric charge generated by a photoelectric conversion unit, which will be described later, to the second substrate 112. The second substrate 112 has a plurality of comparison units 40. Each comparison unit 40 is provided for an individual pixel 10 and configured of a comparator circuit or the like. The comparison unit 40 compares a signal output from the pixel 10 with a reference signal varying at a constant rate with time to output the comparison result to the third substrate 113 and the fourth substrate 114.

The third substrate 113 has a plurality of first storage units 50. The fourth substrate 114 has a plurality of second storage units 60 and output units 100. Each pixel 10 is provided with a first storage unit 50 and a second storage unit 60 each of which is constituted with a latch circuit or the like. As described later in detail, the comparison unit 40, the first storage unit 50, and the second storage unit 60 constitute an integral analog/digital conversion unit (AD conversion unit) 70 that converts an analog signal output from the pixel 10 into a digital signal having a predetermined number of bits. The first storage units 50 store digital signals for lower bits of the digital signal having the predetermined number of bits and the second storage units 50 store digital signals for higher bits of the digital signal having the predetermined number of bits.

When the comparison unit 40 compares the signal output from the pixel 10 with the reference signal, the first storage unit 50 stores a digital signal based on a result of a measurement with a clock signal having a first frequency, the result representing a time until a magnitude relationship changes between the signal output from the pixel 10 and the reference signal. The second storage unit 60 stores a digital signal based on a result of a measurement with a clock signal having a second frequency that is lower than the first frequency, the result representing a time until a magnitude relationship changes between the signal output from the pixel 10 and the reference signal. The digital signals stored in the first storage unit 50 and the second storage unit 60 are output to the corresponding output unit 100. Note that the fourth substrate 114 of the image sensor 3 may include a plurality of ALUs (Arithmetic and Logic Units), i.e., arithmetic units 80, in addition to the output units 100. In a case where the fourth substrate 114 has the arithmetic units 80, the digital signals stored in the first storage units 50 and the second storage units 60 are output to the arithmetic units 80. Each arithmetic unit 80 is provided for an individual pixel 10 to perform arithmetic operations (four arithmetic operations) between digital signals generated for the pixel 10. The arithmetic units 80 are configured to include an addition circuit, a subtraction circuit, a flip-flop circuit, a shift circuit, and the like. The arithmetic units 80 are connected to each other via signal lines, switches SW, or the like. For example, when predetermined switches SW are turned on to select signals of pixels, the arithmetic units 80 perform arithmetic operations on signals of a plurality of selected pixels.

In the present embodiment, among the first storage units 50 and the second storage units 60, the first storage units 50 for storing digital signals for lower bits are arranged closer to the comparison units 40, compared with the second storage units 60. In other words, the first storage units 50 are located between the comparison units 40 and the second storage units 60. In FIG. 3, the third substrate 113 having the first storage units 50 is located between the second substrate 112 having the comparison units 40 and the fourth substrate 114 having the second storage units 60. The first storage units 50 that store digital signals based on the clock signal having the first frequency higher than the second frequency are provided closer to the comparison units 40, compared with the second storage units 60, so that an effect of a signal delay of a signal from the comparison units 40 can be reduced. This can achieve a highly accurate AD conversion.

Figure 4:
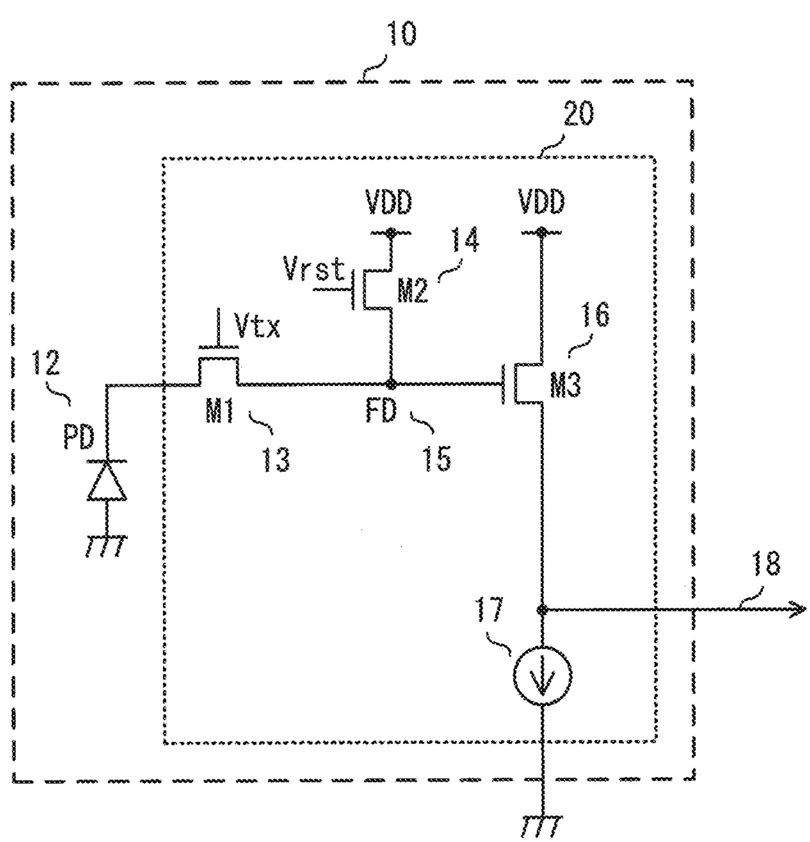
FIG. 4 is a circuit diagram illustrating a configuration of a pixel according to the first embodiment.

FIG. 4 is a circuit diagram illustrating a configuration of the pixel according to the first embodiment. The pixel 10 has a photoelectric conversion unit 12, such as a photodiode (PD), and a readout unit 20. The photoelectric conversion unit 12 has a function of converting incident light into an electric charge and accumulating the photoelectrically converted electric charge. The readout unit 20 includes a transfer unit 13, a discharge unit 14, a floating diffusion (FD) 15, an amplification unit 16, and an electric current source 17.

The transfer unit 13 is controlled by a signal Vtx to transfer the electric charge photoelectrically converted by the photoelectric conversion unit 12 to the floating diffusion 15. In other words, the transfer unit 13 forms an electric charge transfer path between the photoelectric conversion unit 12 and the floating diffusion 15. The floating diffusion 15 holds (accumulates) the electric charge. The amplification unit 16 amplifies a signal caused by the electric charge held in the floating diffusion 15 to output the signal to a signal line 18. In the example illustrated in FIG. 4, the amplification unit 16 includes a transistor M3 having a drain terminal, a gate terminal, and a source terminal, which are respectively connected to a power supply VDD, the floating diffusion 15, and the electric current source 17.

The discharge unit (reset unit) 14 is controlled by a signal Vrst to discharge the electric charge in the floating diffusion 15 and reset a potential of the floating diffusion 15 into a reset potential (reference potential). For example, the transfer unit 13 and the discharge unit 14 respectively include a transistor M1 and a transistor M2. The readout unit 20 reads out, to the signal line 18, a signal (photoelectric conversion signal) corresponding to the electric charge transferred by the transfer unit 13 from the photoelectric conversion unit 12 to the floating diffusion 15.

Figure 5:
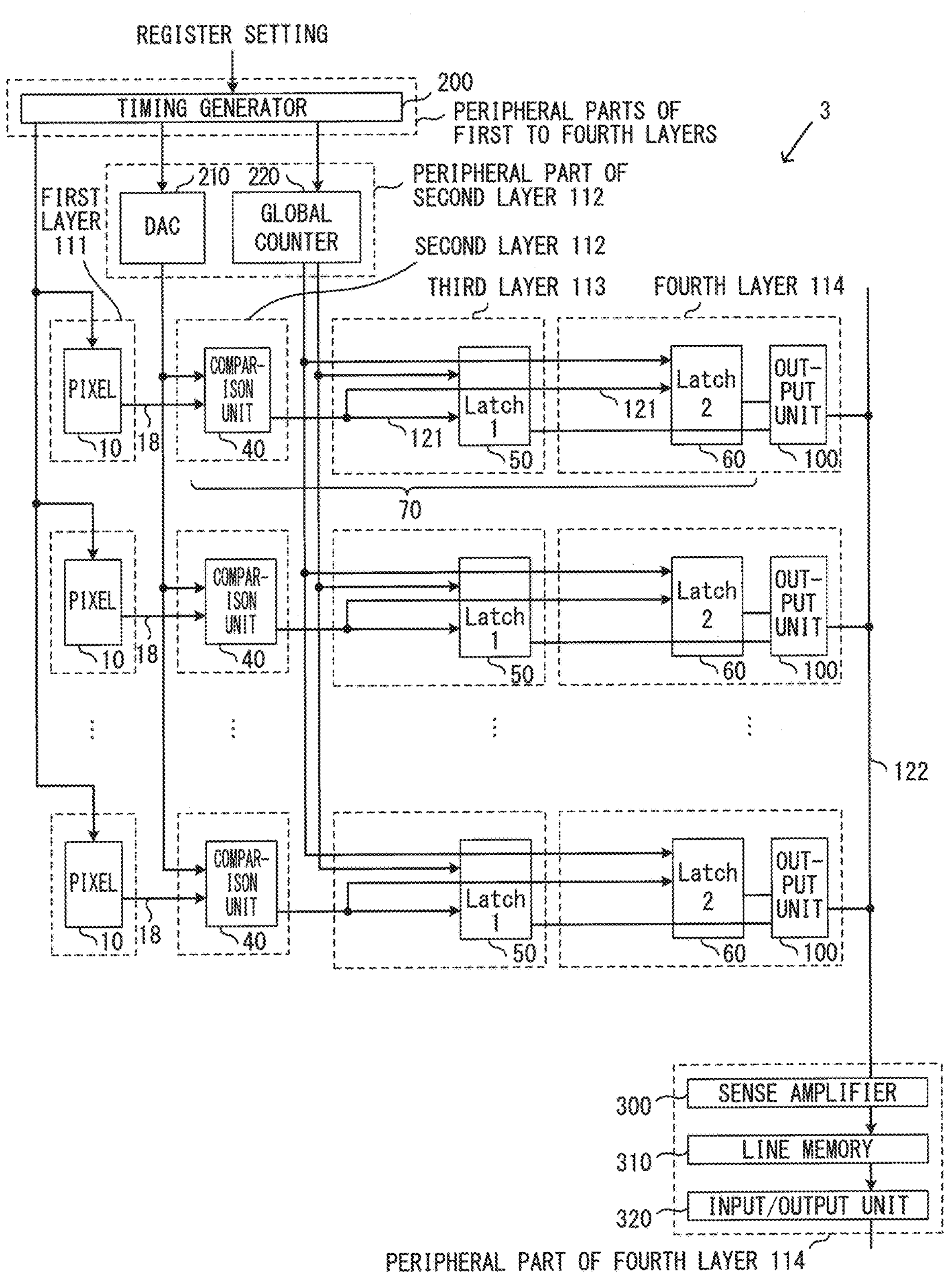
FIG. 5 is a block diagram illustrating details of a configuration of the image sensor according to the first embodiment.

FIG. 5 is a block diagram illustrating details of a configuration of the image sensor according to the first embodiment. The image sensor 3 includes a plurality of pixels 10, AD conversion units 70 provided for individual pixels 10, output units 100, a timing generator 200, a DA conversion unit 210, a global counter 220, a sense amplifier 300, a line memory 310, and an input/output unit 320. Each AD conversion unit 70 is configured to include a comparison unit 40, a first storage unit 50, and a second storage unit 60. The first storage units 50 and the second storage units 60 include latch circuits. In the present embodiment, FIGS. 3 and 5 illustrate only the first storage units 50 and the second storage units 60, for convenience. The image sensor 3 is provided with a plurality of latch circuits (storage units) corresponding to the number of bits of digital signals to be stored. The plurality of latch circuits each store a 1-bit digital signal. In the present embodiment, for example, the third substrate 113 has five latch circuits in addition to the first storage unit 50 so that six latch circuits store a 6-bit digital signal. The fourth substrate 114 has five latch circuits in addition to the second storage unit 60 so that six latch circuits store a 6-bit digital signal. Therefore, the latch circuits of the third substrate 113 and the fourth substrate 114 together store a 12-bit digital signal.

The first layer of the image sensor 3, that is, the first substrate 111 is provided with the pixels 10 and a part of the timing generator 200. The timing generator 200 includes a plurality of circuits, and is distributed on the first substrate 111 to the fourth substrate 114. Note that in FIG. 5, the first substrate 111, the second substrate 112, the third substrate 113, and the fourth substrate 114 are referred to as a first layer, a second layer, a third layer, and a fourth layer, respectively. The circuits constituting the timing generator 200 are arranged in peripheral parts of regions where the pixels 10 and the AD conversion units 70 are arranged. The second layer, that is, the second substrate 112 is provided with comparison units 40, a DA conversion unit 210, a global counter 220, and a part of the timing generator 200. Note that, in a case where the arithmetic units 80 are provided, the arithmetic units 80 are arranged in the peripheral parts in the same manner as the circuits constituting the timing generator 200.

The third substrate 113 is provided with the first storage units 50 and a part of the timing generator 200. The fourth substrate 114 is provided with the second storage units 60, the output units 100, a part of the timing generator 200, the sense amplifier 300, the line memory 310, and the input/output unit 320. The DA conversion unit 210, the global counter 220, the sense amplifier 300, the line memory 310, and the input/output unit 320 are arranged in peripheral parts of regions where the AD conversion units 70 are arranged on the substrates.

The timing generator 200 includes a pulse generation circuit and the like to generate a pulse signal (clock signal) based on a register setting value output from the control unit 4 of the image-capturing apparatus 1, and output the pulse signal to the pixels 10, the comparison units 40, the DA conversion unit 210, the global counter 220, and the like. The register setting value is set in accordance with, for example, a shutter speed (an electric charge accumulation time of the photoelectric conversion unit), an ISO sensitivity, the presence or absence of image correction, and the like. Based on the pulse signal from the timing generator 200, the DA conversion unit 210 generates a ramp signal having a varying signal level as a reference signal. The DA conversion unit 210 is commonly connected to the comparison units 40 provided for the individual pixels 10, and outputs the reference signal to each comparison unit 40. The global counter 220 generates signals (for example, clock signals) indicating count values based on the pulse signal from the timing generator 200, and outputs the signals to the first storage units 50 and the second storage units 60. The digital signals stored in the first storage units 50 and the second storage units 60 can be output to a signal line 122 by the output units 100 provided for the individual pixels 10. Note that in a case where the arithmetic units 80 are provided, each arithmetic unit 80 is provided for an individual pixel 10 to perform arithmetic operations (four arithmetic operations) between digital signals for the pixel 10 output from the first storage unit 50 and the second storage unit. After an arithmetic operation between the pixels, the arithmetic unit 80 outputs the signal obtained by the arithmetic operation to the sense amplifier 300 via the signal line 122.

The sense amplifier 300 is connected to the signal line 122, and reads out the signal input to the signal line 122 at a high-speed by amplifying and reading out the signal. The signal read out by the sense amplifier 300 is stored in the line memory 310. The input/output unit 320 performs signal processing on the signal output from the line memory 310, such as adjustment of a signal bit width and addition of a synchronization code, to output the processed signal as an image signal to the control unit 4 of the image-capturing apparatus 1. The input/output unit 320 includes an input/output circuit or the like that supports a high-speed interface such as LVDS or SLVS to transmit signals at a high speed.

Figure 6:
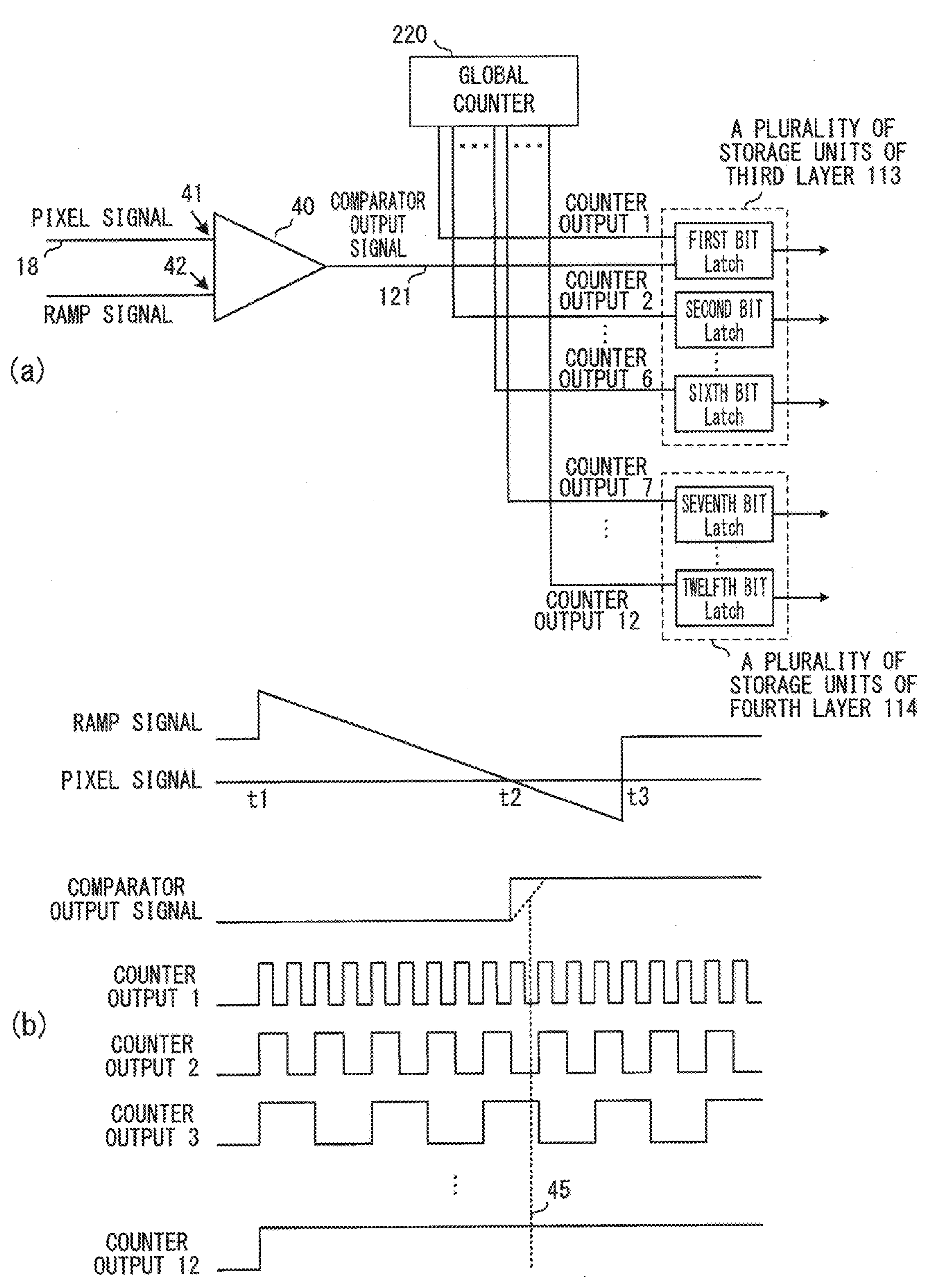
FIG. 6(*a*) is a view illustrating a configuration of an AD conversion unit and a global counter according to the first embodiment.

FIG. 6(*a*) is a diagram illustrating a configuration of the AD conversion unit and the global counter according to the first embodiment. In the example illustrated in FIG. 6(*a*), the comparison unit 40 of the AD conversion unit 70 includes a comparator circuit. A signal output from the pixel 10 via the signal line 18 is input to the first input terminal 41 of the comparison unit 40, and a reference signal (ramp signal) is input from the DA conversion unit 210 to the second input terminal 42. The comparison unit 40 compares the signal output from the pixel 10 with the ramp signal to transition a potential of an output signal when a level of the signal from the pixel 10 and a level of the ramp signal match each other. The comparator output signal, which is the result of the comparison made by the comparison unit 40, is input to the first storage unit 50 and the second storage unit 60 via a level shifter (not illustrated) and the signal line 121.

The first storage unit 50 and the second storage unit 60 store count values as digital signals which correspond to times elapsed from the start time of the comparison made by the comparison unit 40 to the inversion of the comparator output signal, based on the comparator output signal. In other words, the first storage unit 50 and the second storage unit 60 store count values as digital signals which correspond to a time until a magnitude relationship changes between a level of the signal output from the pixel 10 and a level of the ramp signal, based on the signal output from the comparison unit 40. The global counter 220 outputs a plurality of clock signals having different frequencies and uses the clock signals having different frequencies to measure a time until a magnitude relationship changes between the level of the signal from the pixel 10 and the level of the ramp signal. The first storage unit 50 and the second storage unit 60 store the measured results as digital signals. In other words, the plurality of latch circuits including the first storage units 50 and the second storage units 60 store digital signals based on results measured with the clock signals having different frequencies.

FIG. 6(*b*) is a timing chart illustrating an operation example of the AD conversion unit according to the first embodiment. In FIG. 6(*b*), the vertical axis represents voltage levels of signals and the horizontal axis represents time. Counter outputs 1-12 schematically illustrate clock signals indicating count values output from the global counter 220. For example, the counter outputs 1-6 indicate counter values constituting a part for lower bits of digital data, and are input to latch circuits including the first storage units 50. Furthermore, the counter outputs 7-12 indicate counter values constituting a part for higher bits of digital data, and are input to latch circuits including the second storage units 60. Here, the lower bits indicate bits of a digital signal generated by the counter values based on the counter outputs 1-6 among the counter outputs 1-12 output from the global counter 220. The frequencies of the clock signals of the counter outputs 1-6 are higher than those of the clock signals of the counter outputs 7-12. Further, the higher bits indicate bits of a digital signal generated by the counter values based on the counter outputs 7-12 among the counter outputs 1-12 output from the global counter 220. The frequencies of the clock signals of the counter outputs 7-12 are lower than those of the clock signals of the counter outputs 1-6.

After the signal output from the pixel 10 is input to the first input terminal 41 of the comparison unit 40, at time t1, an input of the ramp signal (reference signal) having a varying signal level is started from the DA conversion unit 210 to the comparison unit 40. Additionally, inputs of the counter outputs 1-12 are started from the global counter 220 to the plurality of latch circuits including the first storage units 50 and the second storage units 60. In a period from time t1 to time t3, a potential (level) of the ramp signal decreases with time.

At time t2, when the potential of the signal from the pixel substantially coincides with the potential of the ramp signal, the comparison unit 40 causes the potential of the comparator output signal to transition to high level. The plurality of latch circuits including the first storage units 50 and the second storage units 60 store (hold) the count values based on the counter outputs 1-12 when the comparator output signal transitions from low level to high level. For example, the count value based on the counter output 1 is stored in a first bit latch circuit, the count value based on the counter output 2 is stored in a second bit latch circuit, and the count value based on the counter output 12 is stored in a twelfth bit latch circuit.

The signal line 121 through which the comparator output signal is transmitted is a signal line connecting the comparison unit 40 of the second substrate 112 to the first storage unit 50 of the third substrate 113 and the second storage unit 60 of the fourth substrate 114. The signal line 121 includes the through-hole electrode 110, the bump, or the like illustrated in FIG. 2. In the fourth substrate 114 located away from the comparison units 40 of the second substrate 112, the comparator output signals are delayed and degraded due to wiring parasitic capacitances, inter-layer junction capacitances, and the like, so that variations of the comparator output signal occur among the pixels. For this reason, a deviation of latch timing of performing a latching operation occurs. In the present embodiment, the first storage units 50 that latch the lower-bit digital signals are arranged on the third substrate 113 that is closer to the comparison units 40 of the second substrate 112. In other words, among the counter outputs 1-12, the first storage units 50 which perform a latching operation with signals having relatively high frequencies are arranged on the third substrate 113 that is close to the comparison units 40, and the second storage units 60 which perform a latching operation with signals having relatively low frequencies is arranged on the fourth substrate 114.

The dotted line 45 in FIG. 6(*b*) schematically illustrates the latch timing of the comparator output signal input to the second storage unit 60 of the fourth substrate 114. The input timing of the comparator output signal to the second storage unit 60 may be delayed as indicated by the dotted line 45. However, the frequency of the signal (for example, the counter output 12) indicating the count value input to the second storage unit 60 is low, that is, a change in the count value representing a higher bit is slow; thus, the effect of the deviation of the latch timing can be reduced, which leads to a decrease in a conversion error in the AD conversion. In this way, the effect of the signal delay of the comparator output signal from the comparison unit 40 can be reduced to improve the accuracy in the AD conversion. Furthermore, in the present embodiment, the first storage units 50 that perform a latching operation with signals having are relatively high frequencies is arranged on the second substrate 112 on which the global counter 220 is arranged. In this way, the effect of the signal delay of the count value from global counter 220 can be reduced to improve the accuracy in the AD conversion.

In the present embodiment, the first storage units 50 for lower bits are provided on the third layer 113, and the second storage units 60 for higher bits are provided on the fourth layer 114. However, inversely, the first storage units 50 for lower bits may be provided on the fourth layer 114 and the second storage units 60 for higher bits may be provided on the third layer 113. By arranging the first storage units 50 and the second storage units 60 on different substrates in this way, a plurality of storage units can be arranged without increasing the chip area, and the number of bits (resolution) of the AD conversion can be improved. Additionally, each first storage unit 50 and each second storage unit 60 are stacked on an individual pixel 10. A decrease in an aperture ratio of the pixel 10 can thus be prevented.

According to the above-described embodiment, the following operational advantages can be achieved.

(1) An image sensor 3 includes: a photoelectric conversion unit 12 that photoelectrically converts incident light to generate an electric charge; a readout unit (readout unit 20) that reads out a signal caused by the electric charge generated by the photoelectric conversion unit 12; a comparison unit 40 that outputs a signal based on a comparison between the signal read out by the readout unit and a reference signal; a first circuit layer (a third substrate 113, a wiring layer 143, a wiring layer 144) that has a first storage unit 50 for storing a first signal based on the signal output from the comparison unit 40; and a second circuit layer (a fourth substrate 114, a wiring layer 145) stacked on the first circuit layer, the second circuit layer having a second storage unit 60 for storing a second signal based on the signal output from the comparison unit 40. In the present embodiment, the first storage unit 50 and the second storage unit 60 are arranged on different substrates. In this way, a plurality of storage units can be arranged without increasing the chip area, and the resolution of the AD conversion can be improved.

(2) In the present embodiment, among the first storage unit 50 and the second storage unit 60, the first storage unit 50 for storing a digital signal for a lower bit is arranged closer to the comparison unit 40. In this way, the effect of the signal delay of the signal from the comparison unit 40 can be reduced to achieve a highly accurate AD conversion.

(3) The first storage unit 50 and the second storage unit 60 are stacked on an individual pixel 10. A decrease in an aperture ratio of the pixel 10 can thus be prevented.

(4) An image sensor 3 includes: a photoelectric conversion unit 12 that photoelectrically converts incident light to generate an electric charge; a readout unit (readout unit 20) that reads out a signal caused by the electric charge generated by the photoelectric conversion unit 12; and an AD conversion unit 70 having a comparison unit 40 that outputs a signal based on a comparison between the signal read out by the readout unit and a reference signal, a first circuit layer (a third substrate 113, a wiring layer 143, a wiring layer 144) that has a first storage unit 50 for storing a first signal based on the signal output from the comparison unit 40, and a second circuit layer (a fourth substrate 114, a wiring layer 145) stacked on the first circuit layer, the second circuit layer having a second storage unit 60 for storing a second signal based on the signal output from the comparison unit 40. In this way, a plurality of storage units can be arranged without increasing the chip area, and the resolution of the AD conversion can be improved.

(5) The AD conversion unit 70 converts the signal read out from the photoelectric conversion unit 12 into a digital signal having a predetermined number of bits; the first storage unit 50 stores, as a first digital signal, a digital signal of a relatively lower bit among the digital signal having the predetermined number of bits; the second storage unit 60 stores, as a second digital signal, a digital signal of a relatively higher bit among the digital signal having the predetermined number of bits; and the first storage unit 50 is stacked between the photoelectric conversion unit 12 and the second storage unit 60. In the present embodiment, among the first storage unit 50 and the second storage unit 60, the first storage unit 50 for storing a digital signal for a lower bit is arranged closer to the comparison unit 40, compared with the second storage unit 60. In this way, the effect of the signal delay of the signal from the comparison unit 40 can be reduced to achieve a highly accurate AD conversion.

Second Embodiment

Figure 7:
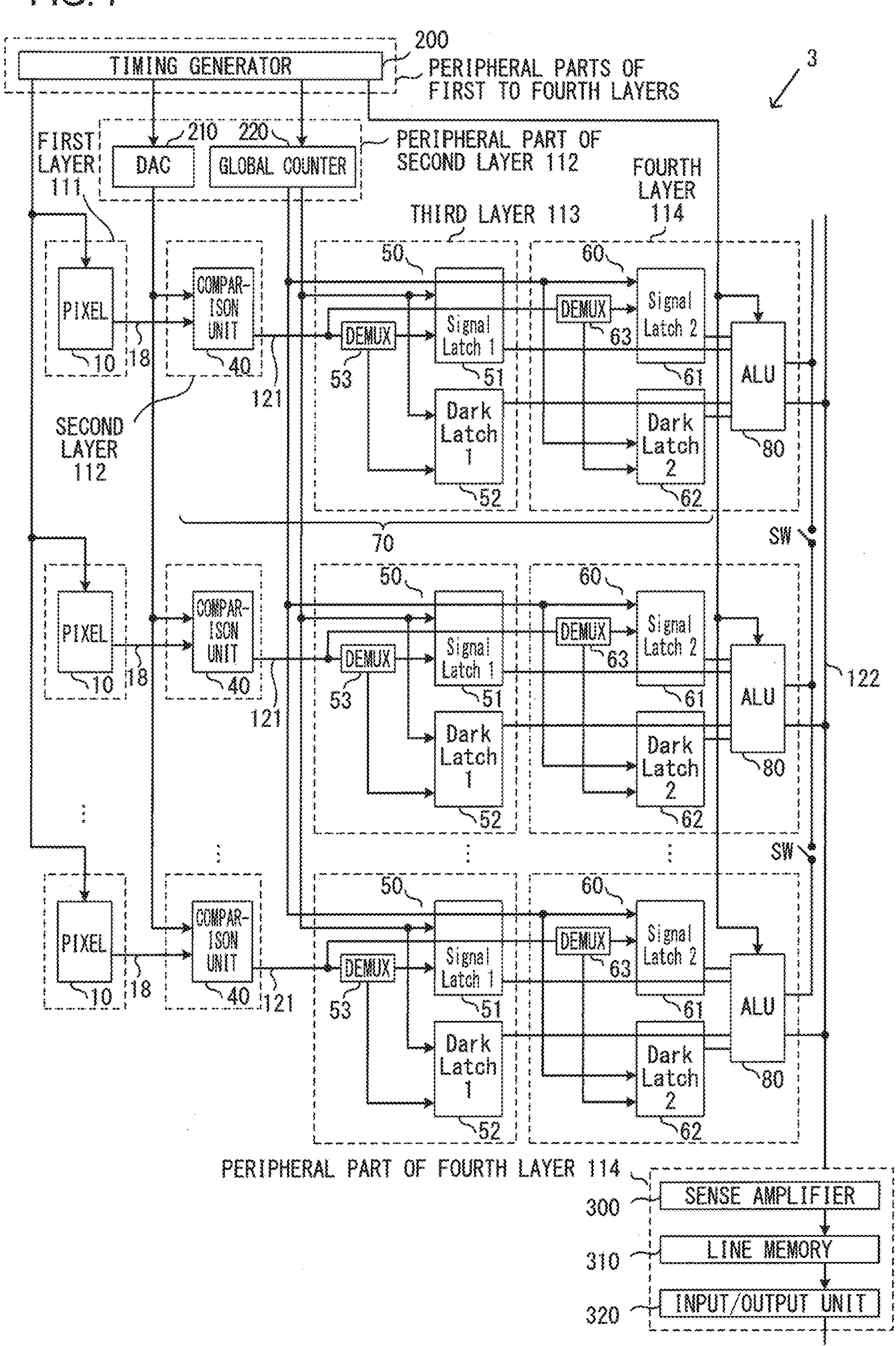
FIG. 7 is a block diagram illustrating details of a configuration of an image sensor according to the second embodiment.

With reference to FIG. 7, an image sensor 3 according to a second embodiment will be described. In the figure, parts that are same as or equivalent to those in the first embodiment are denoted by the same reference numerals, and differences from the image sensor 3 according to the first embodiment will mainly be described. FIG. 7 is a block diagram illustrating details of a configuration of the image sensor according to the second embodiment. The image sensor 3 has a plurality of latch circuits each including a signal storage unit 51 and a dark storage unit 52 constituting a first storage unit 50, and a plurality of latch circuits each including a signal storage unit 61 and a dark storage unit 62 constituting a second storage unit 60.

The readout unit 20 of each pixel 10 sequentially reads out, to the signal line 18, a signal (photoelectric conversion signal) corresponding to the electric charge transferred by the transfer unit 13 from the photoelectric conversion unit 12 to the floating diffusion 15 and a dark signal (noise signal) in a time of resetting a potential of the floating diffusion 15 to the reset potential. The dark signal is used to correct the photoelectric conversion signal. The AD conversion unit 70 sequentially performs AD conversions on the photoelectric conversion signal and on the dark signal. In performing the AD conversion on the photoelectric conversion signal, the AD conversion unit 70 outputs a result of a comparison of the photoelectric conversion signal with the reference signal to the signal storage unit 51 and the signal storage unit 61 via demultiplexers 53, 63. In performing the AD conversion on the dark signal, the AD conversion unit 70 outputs a result of a comparison of the dark signal with the reference signal to the dark storage unit 52 and the dark storage unit 62 via demultiplexers 53, 63.

The AD conversion unit 70 converts the photoelectric conversion signal into a digital signal having a predetermined number of bits and converts the dark signal into a digital signal having a predetermined number of bits. The AD conversion unit 70 stores the digital signal based on the photoelectric conversion signal in the signal storage unit 51 and the signal storage unit 61 and stores the digital signal based on the dark signal in the dark storage unit 52 and the dark storage unit 62. Operations of the AD conversion 70, digital signals stored in a plurality of latch circuits including the signal storage units 51 and the dark storage units 52, and digital signals stored in a plurality of latch circuits including the signal storage units 61 and the dark storage units 62 are the same as those in the first embodiment.

Figure 8:
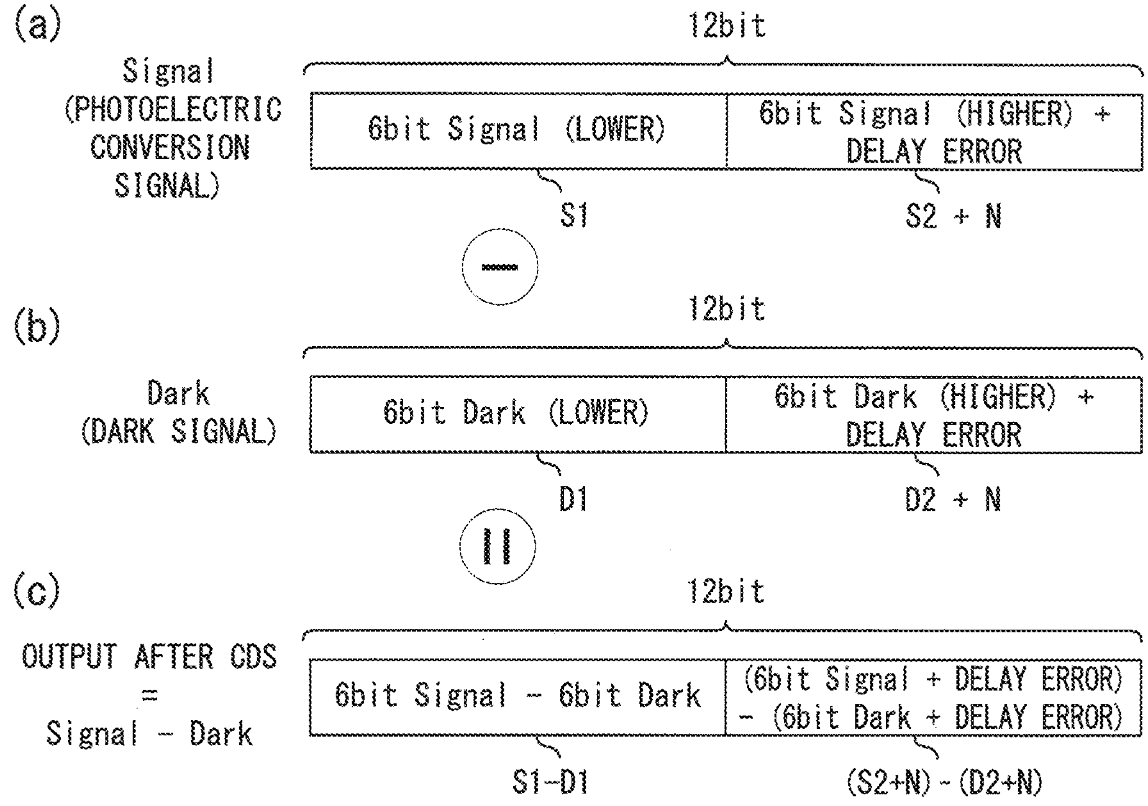
FIG. 8 is a view explaining a configuration of a digital signal stored in a first storage unit and a second storage unit according to the second embodiment.

FIG. 8 is a view explaining a configuration of digital signals stored in the first storage unit 50 and the second storage unit 60. In the example illustrated in FIGS. 7 and 8, the signal storage unit 51, the signal storage unit 61, the dark storage unit 52, and the dark storage unit 62 include latch circuits, and each of the stored digital signals is a 1-bit signal. In the present embodiment, FIG. 7 illustrates only the signal storage unit 51, the signal storage unit 61, the dark storage unit 52, and the dark storage unit 62, for convenience. As in the first embodiment, the image sensor 3 is provided with a plurality of latch circuits (storage units) corresponding to the number of bits of digital signals to be stored. Each of the plurality of latch circuits stores a 1-bit digital signal. In the present embodiment, for example, the third substrate 113 has five latch circuits in addition to the signal storage unit 51 and five latch circuits in addition to the dark storage unit 52. The six signal latch circuits store a 6-bit digital signal generated from the photoelectric conversion signal. The six dark signal latch circuits store a 6-bit digital signal generated from the dark signal. Similarly, the fourth substrate 114 has five latch circuits in addition to the signal storage unit 61 and five latch circuits in addition to the dark storage unit 62. The six signal latch circuits store a 6-bit digital signal generated from the photoelectric conversion signal. The six dark signal latch circuits store a 6-bit digital signal generated from the dark signal. The signal storage unit 61 and the dark storage unit 62 are provided on the fourth substrate 114 located away from the comparison unit 40, compared with the signal storage unit 51 and the dark storage unit 52. Therefore, AD conversion errors caused by the delay of the comparator output signal may occur in signals stored in the signal storage unit 61 and the dark storage unit 62.

The plurality of latch circuits including the signal storage units 51 store a lower 6-bit digital signal S1 based on the photoelectric conversion signal. The plurality of latch circuits including the signal storage units 61 store a signal (S2+N) obtained by adding a higher 6-bit signal S2 based on the photoelectric conversion signal and a delay error N corresponding to the AD conversion error. Additionally, the plurality of latch circuits including the dark storage units 52 store a lower 6-bit digital signal D1 based on the dark signal. The plurality of latch circuits including the dark storage units 62 store a signal (D2+N) obtained by adding a higher 6-bit signal D2 based on the dark signal and a delay error N corresponding to the AD conversion error. Thus, as illustrated in FIG. 8(*a*), the signal S1 and the signal (S2+N) constitute a 12-bit digital signal based on the photoelectric conversion signal. Furthermore, as illustrated in FIG. 8(*b*), the signal D1 and the signal (D2+N) constitute a 12-bit digital signal based on the dark signal.

The arithmetic unit 80 performs a correlated double sampling (CDS) by a subtraction between the digital signal of the photoelectric conversion signal and the digital signal of the dark signal, that is, a digital CDS. The arithmetic unit 80 generates a correction signal by a subtraction between a digital signal corresponding to the photoelectric conversion signal output from a plurality of latch circuits including the signal storage units 51 and a plurality of latch circuits including the signal storage units 61 and a digital signal corresponding to the dark signal output from a plurality of latch circuits including the dark storage units 52 and a plurality of latch circuits including the dark storage units 62. For example, the arithmetic unit 80 performs a subtraction between the signal S1 from the plurality of latch circuits including the signal storage units 51 and the signal D1 from the plurality of latch circuits including the dark storage units 52 to obtain a signal A1 (=S1−D1) constituting lower 6 bits of the correction signal. Additionally, the arithmetic unit 80 performs a subtraction between the signal (S2+N) from the plurality of latch circuits including the signal storage units 61 and the signal (D2+N) from the plurality of latch circuits including the dark storage units 62 to obtain a signal A2 (=S2−D2) constituting higher 6 bits of the correction signal. Performing the subtraction between the signal (S2+N) and the signal (D2+N) can remove the delay error N corresponding to the AD conversion error. As a result, the correction signal after the CDS processing includes the signal A1 (=S1−D1) and the signal A2 (=S2−D2).

In a case where a storage unit for storing a digital signal based on the photoelectric conversion signal and a storage unit for storing a digital signal based on the dark signal are arranged on different substrates, the delay error N is included in either one of the digital signal and the dark signal. In this case, the delay error N cannot be removed by CDS processing. In the present embodiment, the signal storage unit 51 and the dark storage unit 52 for storing lower bit signals are arranged on the third substrate 113, and the signal storage unit 61 and the dark storage unit 62 for storing higher bit signals are arranged on the fourth substrate 114. Thus, the delay error N can be removed by CDS processing to improve the accuracy in the AD conversion.

In the second embodiment, the signal storage unit 51 for lower bit of the digital signal of the photoelectric conversion signal and the dark storage unit 52 for lower bit of the digital signal of the dark signal are provided on the third substrate 113, and the signal storage unit 61 for a higher bit of the digital signal of the photoelectric conversion signal and the dark storage unit 62 for a higher bit of the digital signal of the dark signals are provided on the fourth substrate 114. Instead, the signal storage unit 51 for lower bit of the digital signal of the photoelectric conversion signal and the dark storage unit 52 for lower bit of the digital signal of the dark signal may be provided on the fourth substrate 114, and the signal storage unit 61 for a higher bit of the digital signal of the photoelectric conversion signal and the dark storage unit 62 for a higher bit of the digital signal of the dark signal may be provided on the third substrate 113. Even in this case, errors caused by a signal delay may occur in the signal storage unit 51 for lower bit and the dark storage unit 52 for lower bit of the fourth substrate 114. However, the signal delay errors have substantially equal values both in the signal storage unit 51 for lower bit and the dark storage unit 52 for lower bit provided on the same substrate, and can be removed by CDS processing.

According to the above-described embodiment, the following operational advantages can be achieved in addition to the same operational advantages as those of the first embodiment.

(6) A signal read out from the photoelectric conversion unit 12 include a photoelectric conversion signal and a noise signal, and the image sensor 3 has a first storage unit for the photoelectric conversion signal (signal storage unit 51) and a first storage unit for the noise signal (dark storage unit 52) which respectively store a first digital signal of the photoelectric conversion signal and a first digital signal of the noise signal, based on a comparison result in the comparison unit 40. The image sensor 3 has a second storage unit for the photoelectric conversion signal (signal storage unit 61) and a second storage unit for the noise signal (dark storage unit 62) which respectively store a second digital signal of the photoelectric conversion signal and a second digital signal of the noise signal, based on a comparison result in the comparison unit 40. The first storage unit for the photoelectric conversion signal and the first storage unit for the noise signal are provided on the same substrate (in a first circuit layer), and the second storage unit for the photoelectric conversion signal and the second storage unit for the noise signal are provided on the same substrate (in a second circuit layer). The delay error N can thus be removed by CDS processing to improve the accuracy in the AD conversion.

(7) The image sensor 3 further includes an arithmetic unit (arithmetic unit 80) that calculates a difference between the first digital signal of the photoelectric conversion signal and the first digital signal of the noise signal stored in the first storage unit 50, and calculates a difference between the second digital signal of the photoelectric conversion signal and the second digital signal of the noise signal stored in the second storage unit 60. In this way, the arithmetic unit 80 can remove the delay error N.

The following modifications are also included in the scope of the present invention, and one or more of the modifications may be combined with the above-described embodiments.

First Modification

Figure 9:
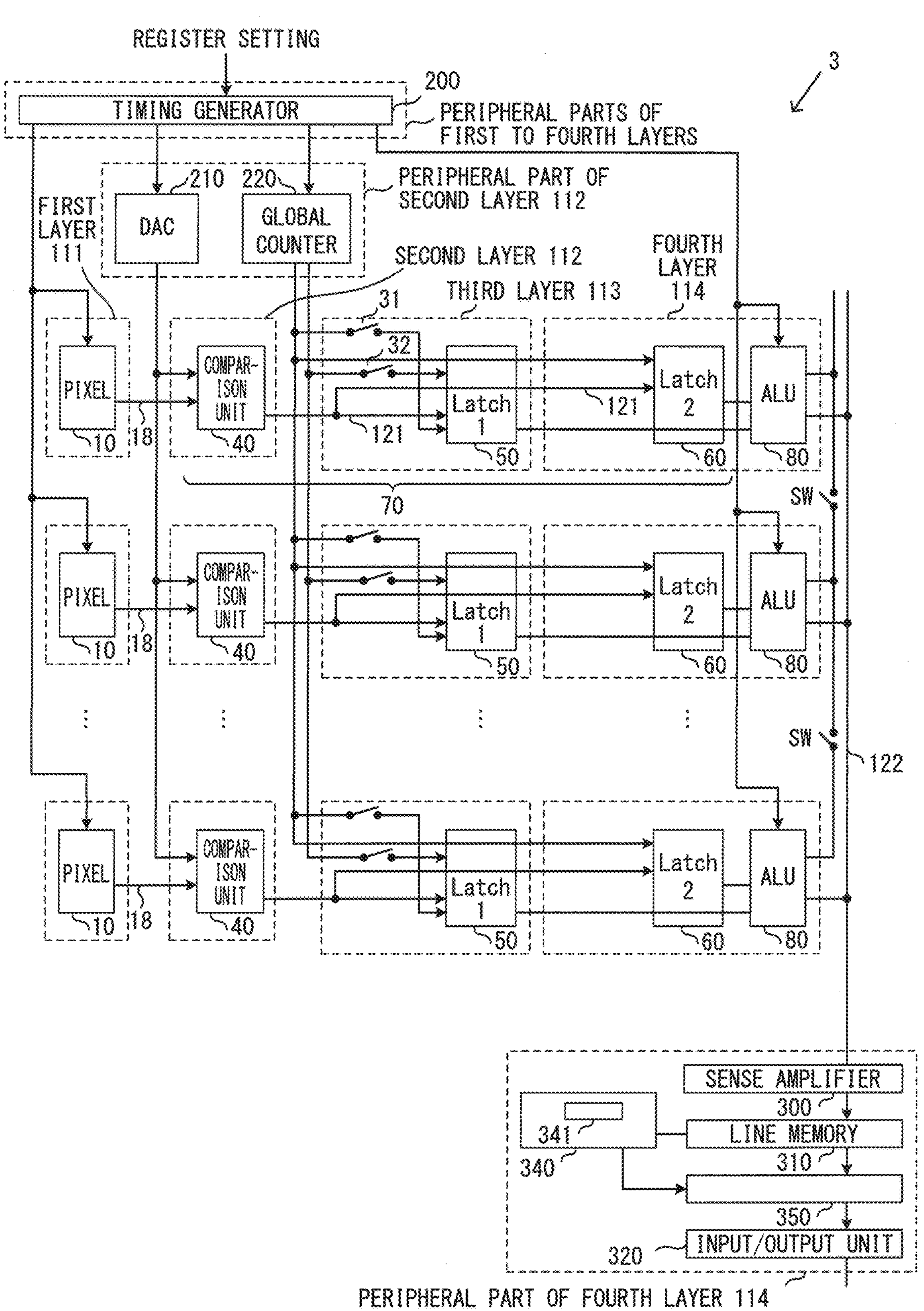
FIG. 9 is a block diagram illustrating details of a configuration of an image sensor according to a first modification.

FIG. 9 is a block diagram illustrating details of a configuration of an image sensor according to a first modification. The image sensor 3 according to the first modification calculates a delay error N caused by a delay of a comparator output signal and uses the delay error N to correct a digital signal. The image sensor 3 includes a first switch unit 31, a second switch unit 32, an error amount calculation unit 340, and an error amount correction unit 350. The first switch unit 31 and the second switch unit 32 each include a transistor and the like. When the delay error N is calculated, the first switch unit 31 is turned on and the second switch unit 32 is turned off. As a result, the same clock signal is input from the global counter 220 to the first storage unit 50 of the third substrate 113 and the second storage unit 60 of the fourth substrate 114. The first storage unit 50 and the second storage unit 60 each use a clock signal indicating the same count value to perform a latching operation. The digital signals stored in the first storage unit 50 and the second storage unit 60 are output to the line memory 310 via the sense amplifier 300.

The error amount calculation unit 340 reads out the count value from the first storage unit 50 and the count value from the second storage unit 60 from the line memory 310 and performs a subtraction between the count values to calculate a delay error N. The error amount calculation unit 340 stores the calculated delay error N in a memory 341. Note that the delay error N may be stored in the memory 341 in advance at the time of product shipping or may be stored before photographing. At the time of actual photographing, the first switch unit 31 is turned off and the second switch unit 32 is turned on. When the actual photographing is performed to store a digital signal in the line memory 310, the error amount correction unit 350 uses the delay error N stored in the error amount calculation unit 340 to correct the signal. For example, the delay error Nis subtracted from the digital data stored in the line memory 310. Additionally, the error amount correction unit 350 outputs the corrected signal as an image signal to the input/output unit 320. This can remove the delay error N caused by the delay of the comparator output signal.

Second Modification

In the image sensor 3 according to the first modification, the error amount calculation unit 340 calculates the delay error N caused by the delay of the comparator output signal and the error amount correction unit 350 uses the delay error N to correct the digital signal. However, the arithmetic unit 80 may calculate the delay error N and uses the delay error N to correct the digital signal. In other words, the arithmetic unit 80 functionally includes the error amount calculation unit 340 and the error amount correction unit 350. In this case, as in the case of the first modification, the first storage unit 50 and the second storage unit 60 are each configured to perform a latching operation with a clock signal indicating the same count value to output the digital signal stored in each storage unit to the arithmetic unit 80.

The arithmetic unit 80 performs a subtraction between the count value from the first storage unit 50 and the count value from the second storage unit 60 to calculate the delay error N. Furthermore, the arithmetic unit 80 stores the calculated delay error N in a latch circuit or the like in the arithmetic unit 80. Note that the delay error N may be stored in advance at the time of product shipping or may be stored before photographing. At the time of actual shooting, the arithmetic unit 80 uses the delay error N to correct the signal. For example, the delay error N is subtracted from the digital signal from the second storage unit 60. This can remove the delay error N caused by the delay of the comparator output signal.

Third Modification

In the above-described embodiments, the first substrate 111 has the pixels 10, the second substrate 112 has the comparison units 40, the third substrate 113 has a plurality of storage units (latch circuits) including the first storage units 50, and the fourth substrate 114 has a plurality of storage units (latch circuits) including the second storage units 60; and the four substrates are stacked together. However, the number of substrates is not limited to four. In the image sensor 3, it is only required that two or more substrates are stacked. For example, the pixel 10 and the comparison unit 40 may be provided on the same substrate. Additionally, the comparison unit 40 and the first storage unit 50 may be provided on the same substrate. The photoelectric conversion unit 12, the comparison unit 40, and the first storage unit 50 may be provided on the same substrate. Furthermore, the first storage unit 50 and the second storage unit 60 may be provided on the same substrate. In this case, the first storage unit 50 is disposed closer to the comparison unit 40, compared with the second storage unit 60. The image sensor may have a stacked configuration of a substrate having the comparison units 40 and a substrate having storage units (latch circuits). By forming the AD conversion unit as a stacked structure of the circuit layer having the comparison units 40 and the circuit layer having the storage units, a plurality of storage units can be arranged without increasing the chip area to improve a resolution of the AD conversion. Furthermore, there may be three or more substrates having storage units (latch circuits), including the third substrate 113 and the fourth substrate 114. For example, four storage units may be provided for each of three substrates, or one storage unit may be provided for each of twelve substrates to form twelve storage units (latch circuits) for storing a 12-bit digital signal.

In the above-described embodiments, the first storage units 50 corresponding to lower bits and the second storage units 60 corresponding to higher bits are provided. However, third storage units may be provided which store digital signals of bits that are relatively middle with respect to higher bits and lower bits. In this case, based on the signal output from the comparison unit 40, a time until a magnitude relationship changes between the signal output from the pixel 10 and the reference signal is measured with a clock signal having a third frequency that is lower than the second frequency. The third storage unit stores a third signal based on a result of a measurement with a clock signal having a third frequency. A digital signal based on a clock signal having a first frequency is referred to as a lower-bit digital signal, a digital signal based on a clock signal having a second frequency is referred to as a middle-bit digital signal, and a digital signal based on a clock signal having a third frequency is referred to as a higher-bit digital signal.

The first storage unit, the second storage unit, and the third storage unit may be arranged on mutually different substrates. The substrate having the second storage units 60 may be arranged between the substrate having the first storage units 50 and the substrate having the third storage units so that the second storage units 60 are located between the first storage units 50 and the third storage units. The first storage units 50 and the second storage units 60 may be provided on the same substrate, while only the third storage units may be provided on a different substrate. The first storage units 50 are arranged closer to the comparison units 40, compared with the second storage units 60. The substrate having the first storage units 50 and the second storage units 60 may be arranged between the substrate having the comparison units 40 and the substrate having the third storage units. The second storage units 60 and the third storage units may be provided on the same substrate.

Fourth Modification

In the above-described embodiments, the AD conversion into a 12-bit digital signal is performed. However, the embodiment can be similarly applied to an AD conversion of any number of bits. A plurality of latch circuits (storage units) corresponding to a certain number of bits may be provided. The third substrate 113 and the fourth substrate 114 may each include any number of latch circuits. For example, in the first embodiment, the number of latch circuits included in each of the third substrate 113 and the fourth substrate 114 is not limited to six. The number of latch circuits included in each of the third substrate 113 and the fourth substrate 114 may be less than six, or six or more. Therefore, the sum of digital signals stored in the latch circuits included in the third substrate 113 and the fourth substrate 114 may be less than 12 bits, or 12 bits or more.

Furthermore, in a case where the first storage unit 50 and the second storage unit 60 are arranged on different substrates, a plurality of latch circuits or the like corresponding to a certain number of bits may be distributed on different substrates. The number of latch circuits including the first storage units 50 of the third substrate 113 and the number of latch circuits including the second storage units 60 of the fourth substrate 114 may be different from each other. For example, the third substrate 113 may have eight latch circuits including the first storage units 50, and the fourth substrate 114 may have six latch circuits including the second storage units 60. Similarly, in the second embodiment, when the photoelectric conversion signal is converted into a 12-bit digital signal and the dark signal is converted into an 8-bit digital signal, the number of latch circuits is not limited. The number of dark signal latch circuits including the dark storage units 52 of the third substrate 113 and the number of dark latch circuits including the dark storage units 62 of the fourth substrate 114 may be different from each other. For example, the third substrate 113 has six signal latch circuits including the signal storage units 51 and six dark latch circuits including the dark storage units 52. The fourth substrate 114 has six signal latch circuits including the signal storage units 61 and two dark latch circuits including the dark storage units 62. Additionally, the dark storage units 52 may be provided only on the third substrate 113. The fourth substrate 114 may have no dark storage units 62. The number of signal storage units and the number of dark storage units included in the third substrate 113 or the fourth substrate 114 may be different from each other.

Fifth Modification

In the above-described embodiments, the image sensor 3 is configured as a back illuminated type image sensor. However, the image sensor 3 may have a front side illumination type configuration in which the wiring layer 140 is provided on a light incident surface side on which light is incident.

Sixth Modification

In the above-described embodiments, a photodiode is used as the photoelectric conversion unit 12. However, a photoelectric conversion film may be used as the photoelectric conversion unit 12.

Seventh Modification

The image sensor 3 described in the above-described embodiments may be applied to cameras, smartphones, tablets, built-in cameras for PCs, in-vehicle cameras, or the like.

Although various embodiments and modifications have been described above, the present invention is not limited to these. Other aspects contemplated within the technical idea of the present invention are also included within the scope of the present invention.

The disclosure of the following priority application is herein incorporated by reference:

Japanese Patent Application No. 2016-65491 (filed Mar. 29, 2016)

REFERENCE SIGNS LIST

3 . . . image sensor, 12 . . . photoelectric conversion unit, 10 . . . pixel, 40 . . . comparison unit, 50 . . . first storage unit, 60 . . . second storage unit, 70 . . . . AD conversion unit, 80 . . . arithmetic unit.

The invention claimed is:

1. An image sensor comprising:

a plurality of substrates that are laminated on each other, wherein:

the plurality of substrates includes:

a first pixel that includes (i) a first photoelectric conversion unit that photoelectrically converts light to an electric charge, (ii) a first transfer unit that transfers the electric charge converted by the first photoelectric conversion unit to a first floating diffusion, and (iii) a first transistor that includes a gate electrically connected to the first floating diffusion and outputs a first signal that is based on the electric charge transferred to the first floating diffusion, and a first conversion unit that converts the first signal output from the first pixel into a digital signal, the first conversion unit including (a) a first comparator circuit includes a first input terminal to which the first signal is input, (b) a first group of latch circuits configured to store a plurality of bits, and (c) a second group of latch circuits con figured to store a plurality of bits, the first group of latch circuits and the second group of latch circuits being storage circuits that store a first digital signal converted from the first signal to the digital signal wherein the second group of latch circuits is arranged, among the plurality of substrates, on a different substrate from a substrate on which the first group of latch circuits is arranged.

2. The image sensor according to claim 1, wherein:

the storage circuits are arranged, among the plurality of substrates, on different substrates from a substrate on which the first comparator circuit is arranged.

3. An image-capturing apparatus comprising:

the image sensor according to claim 2.

4. The image sensor according to claim 2, wherein:

the first comparator circuit includes a second input terminal to which a reference signal is input for comparison with the first signal input to the first input terminal.

5. The image sensor according to claim 1, wherein:

at least one group of latch circuits among the first group of latch circuits and the second group of latch circuits is arranged on a different substrate from the substrate on which the first comparator circuit is arranged.

6. The image sensor according to claim 1, wherein:

the first photoelectric conversion unit is arranged on a first substrate among the plurality of substrates; and at least one group of latch circuits among the first group of latch circuits and the second group of latch circuits is arranged on a second substrate, among the plurality of substrates, different from the first substrate.

7. The image sensor according to claim 1, wherein:

the plurality of substrates includes:

a second pixel that includes (i) a second photoelectric conversion unit that converts light into an electric charge, (ii) a second transfer unit that transfers the electric charge converted by the second photoelectric conversion unit to a second floating diffusion, and (iii) a second transistor that includes a gate electrically connected to the second floating diffusion and outputs a second signal that is based on the electric charge transferred to the second floating diffusion; and a second conversion unit that converts the second signal output from the second pixel into a digital signal, the first photoelectric conversion unit and the second photoelectric conversion unit being arranged along a row direction.

8. The image sensor according to claim 7, wherein:

the second photoelectric conversion unit is arranged adjacent to the first photoelectric conversion unit in the row direction.

9. The image sensor according to claim 7, wherein:

the plurality of substrates includes a second discharge unit that discharges the electric charge of the second floating diffusion.

10. The image sensor according to claim 1, wherein:

the plurality of substrates includes:

a second pixel that includes (i) a second photoelectric conversion unit that converts light into an electric charge, (ii) a second transfer unit that transfers the electric charge converted by the second photoelectric conversion unit to a second floating diffusion, and (iii) a second transistor that includes a gate electrically connected to the second floating diffusion and outputs a second signal that is based on the electric charge transferred to the second floating diffusion; and a second conversion unit that converts the second signal output from the second pixel into a digital signal, the first photoelectric conversion unit and the second photoelectric conversion unit being arranged along a column direction.

11. The image sensor according to claim 10, wherein:

the second photoelectric conversion unit is arranged adjacent to the first photoelectric conversion unit in the column direction.

12. The image sensor according to claim 10, wherein:

the plurality of substrates includes a second discharge unit that discharges the electric charge of the second floating diffusion.

13. The image sensor according to claim 2, wherein:

the plurality of substrates includes:

a second pixel that includes (i) a second photoelectric conversion unit that converts light into an electric charge, (ii) a second transfer unit that transfers the electric charge converted by the second photoelectric conversion unit to a second floating diffusion, and (iii) a second transistor that includes a gate electrically connected to the second floating diffusion and outputs a second signal that is based on the electric charge transferred to the second floating diffusion; and a second conversion unit that converts the second signal output from the second pixel into a digital signal, the first photoelectric conversion unit and the second photoelectric conversion unit being arranged along a row direction.

14. The image sensor according to claim 13, wherein:

the second photoelectric conversion unit is arranged adjacent to the first photoelectric conversion unit in the row direction.

15. The image sensor according to claim 13, wherein:

the plurality of substrates includes a second discharge unit that discharges the electric charge of the second floating diffusion.

16. The image sensor according to claim 2, wherein:

the plurality of substrates includes:

a second pixel that includes (i) a second photoelectric conversion unit that converts light into an electric charge, (ii) a second transfer unit that transfers the electric charge converted by the second photoelectric conversion unit to a second floating diffusion, and (iii) a second transistor that includes a gate electrically connected to the second floating diffusion and outputs a second signal that is based on the electric charge transferred to the second floating diffusion; and a second conversion unit that converts the second signal output from the second pixel into a digital signal, the first photoelectric conversion unit and the second photoelectric conversion unit being arranged along a column direction.

17. The image sensor according to claim 16, wherein:

the second photoelectric conversion unit is arranged adjacent to the first photoelectric conversion unit in the column direction.

18. The image sensor according to claim 16, wherein:

the plurality of substrates includes a second discharge unit that discharges the electric charge of the second floating diffusion.

19. An image-capturing apparatus comprising:

the image sensor according to claim 1.

20. The image sensor according to claim 1, wherein: the plurality of substrates includes a first discharge unit that discharges the electric charge of the first floating diffusion.

21. The image sensor according to claim 1, wherein: the plurality of bits stored in the first group of latch circuits are received from the first comparator circuit without being stored in the second group of latch circuits, and the plurality of bits stored in the second group of latch circuits are received from the first comparator circuit without being stored in the first group of latch circuits.

22. The image sensor according to claim 1, further comprising:

a first signal line through which the plurality of bits stored in the first group of latch circuits are transmitted from the first comparator circuit to the first group of latch circuits without being stored in the second group of latch circuits, and a second signal line through which the plurality of bits stored in the second group of latch circuits are transmitted from the first comparator circuit to the second group of latch circuits without being stored in the first group of latch circuits.

23. The image sensor according to claim 1, wherein:

the plurality of bits stored in the first group of latch circuits are an initial plurality of bits among bits generated by the first comparator circuit from the first signal, the plurality of bits stored in the second group of latch circuits are a subsequent plurality of bits to the initial plurality of bits among the bits generated by the first comparator circuit from the first signal, the initial plurality of bits are not stored in the second group of latch circuits, and the subsequent plurality of bits are not stored in the first group of latch circuits.

* * * * *